United States Patent [19]

Iwakura et al.

[11] Patent Number: 5,315,237
[45] Date of Patent: May 24, 1994

[54] TOUCH SENSOR UNIT OF PROBER FOR TESTING ELECTRIC CIRCUIT AND ELECTRIC CIRCUIT TESTING APPARATUS USING THE TOUCH SENSOR UNIT

[75] Inventors: Kenichi Iwakura; Tetsuo Ohtsuka, both of Kawasaki, Japan

[73] Assignee: Tokyo Electron Limited, Tokyo, Japan

[21] Appl. No.: 741,071

[22] Filed: Aug. 6, 1991

[30] Foreign Application Priority Data

Aug. 6, 1990 [JP] Japan .................................. 2-207947

[51] Int. Cl.⁵ ...................... G01R 31/02; G01R 1/073
[52] U.S. Cl. ............................. 324/158 F; 324/158 P
[58] Field of Search ............... 324/158 F, 158 P, 72.5; 33/558

[56] References Cited

U.S. PATENT DOCUMENTS

| | | | |
|---|---|---|---|
| 1,553,814 | 9/1925 | Hansen .................................. | 33/558 |
| 3,446,065 | 5/1969 | Wiesler et al. ......................... | 73/105 |
| 4,158,171 | 6/1979 | Abbe et al. ....................... | 324/158 F |
| 4,195,259 | 3/1980 | Reid et al. ........................ | 324/158 P |
| 4,342,957 | 8/1982 | Russell ............................. | 324/158 P |
| 5,019,771 | 5/1991 | Yang et al. ....................... | 324/158 P |

FOREIGN PATENT DOCUMENTS

| | | |
|---|---|---|
| 58-162045 | 9/1983 | Japan . |
| 58-182239 | 10/1983 | Japan . |
| 59-47737 | 3/1984 | Japan . |
| 59-138345 | 8/1984 | Japan . |

Primary Examiner—Ernest F. Karlsen
Attorney, Agent, or Firm—Oblon, Spivak, McClelland, Maier & Neustadt

[57] ABSTRACT

A touch sensing unit has an ac signal generator for supplying an ac signal to a semiconductor chip of a semiconductor wafer or a test probe needle, and a touch sensor for sensing formation of an ac signal loop passing an ac signal of the signal generator when the test probe needle and the IC chip are touched with each other by being relatively approached to each other.

16 Claims, 7 Drawing Sheets

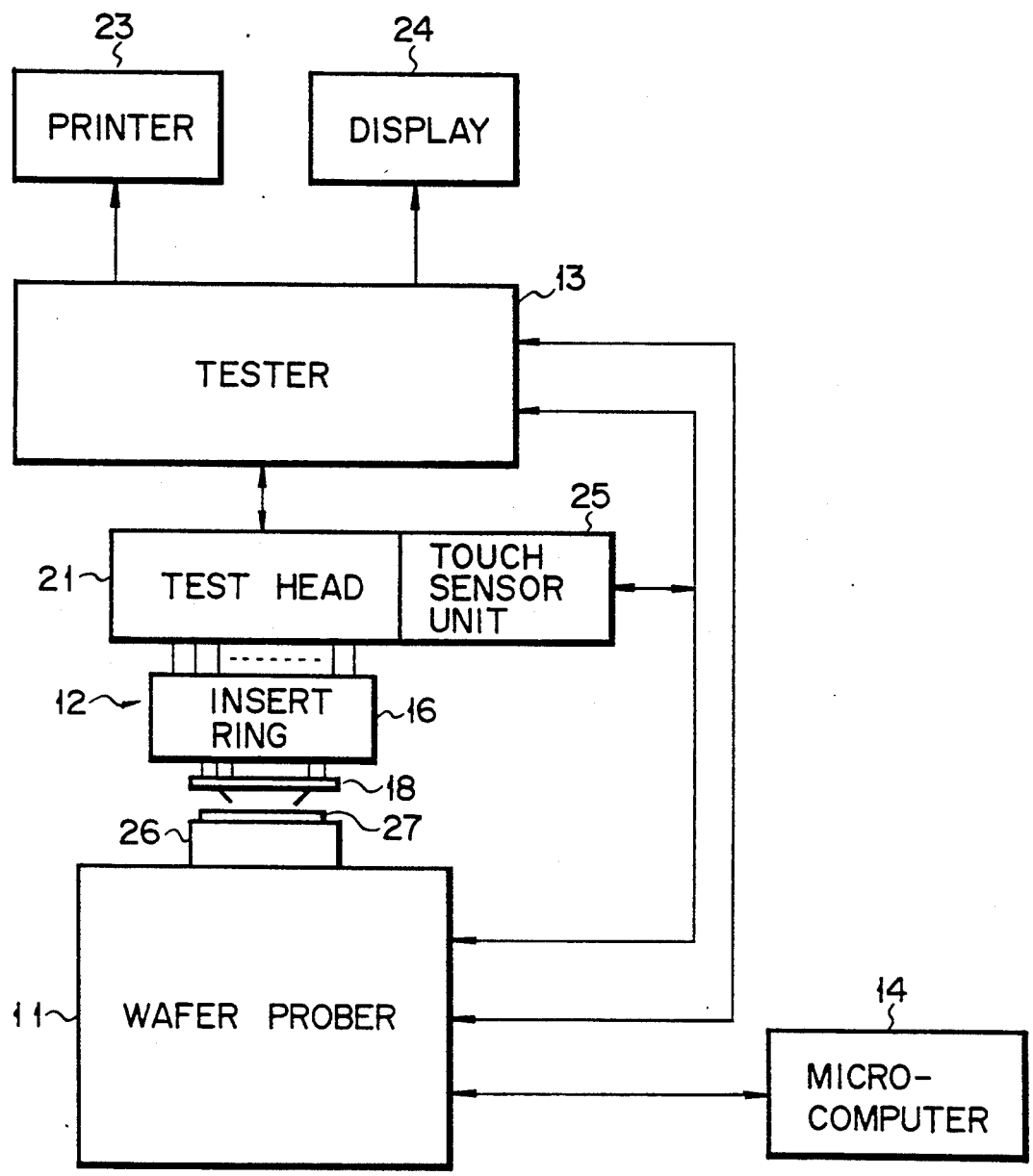
F I G. 1

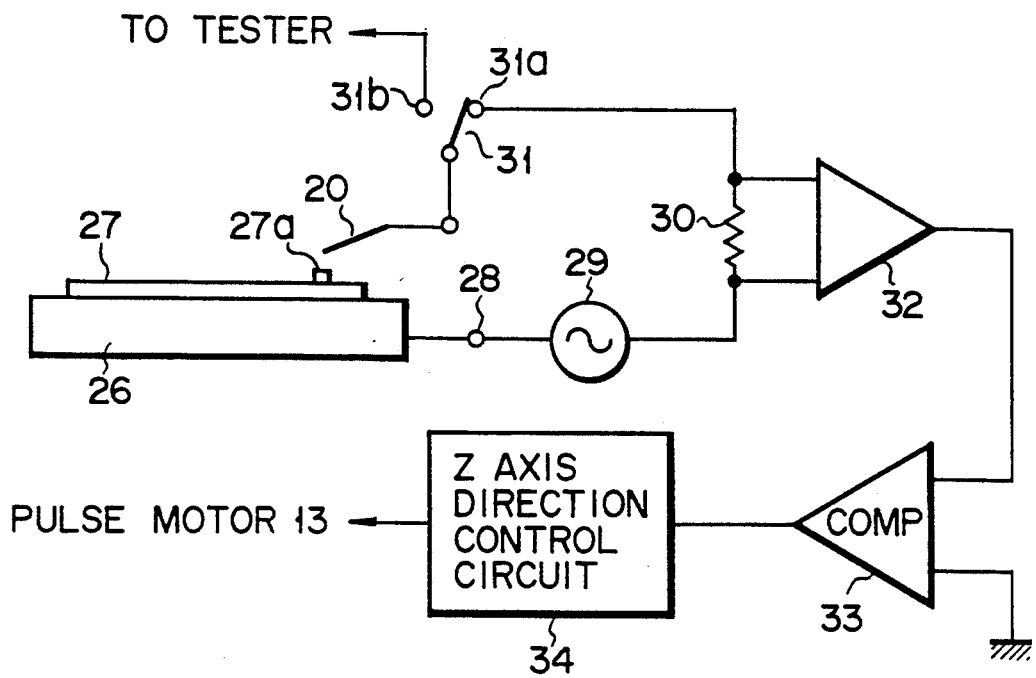
F I G. 4
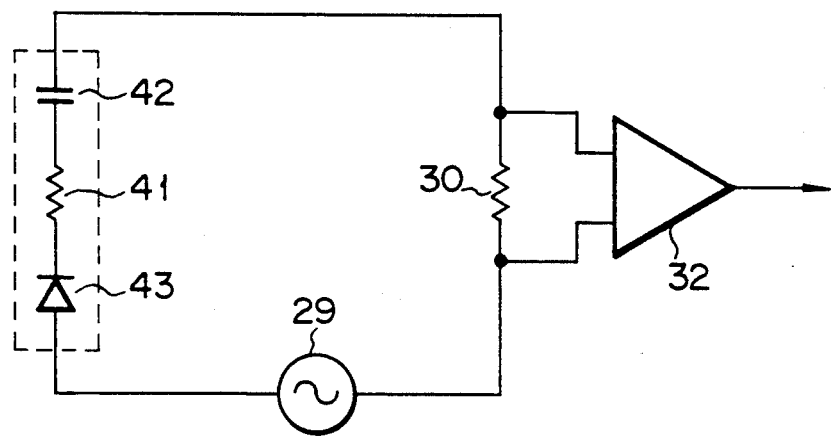
F I G. 5

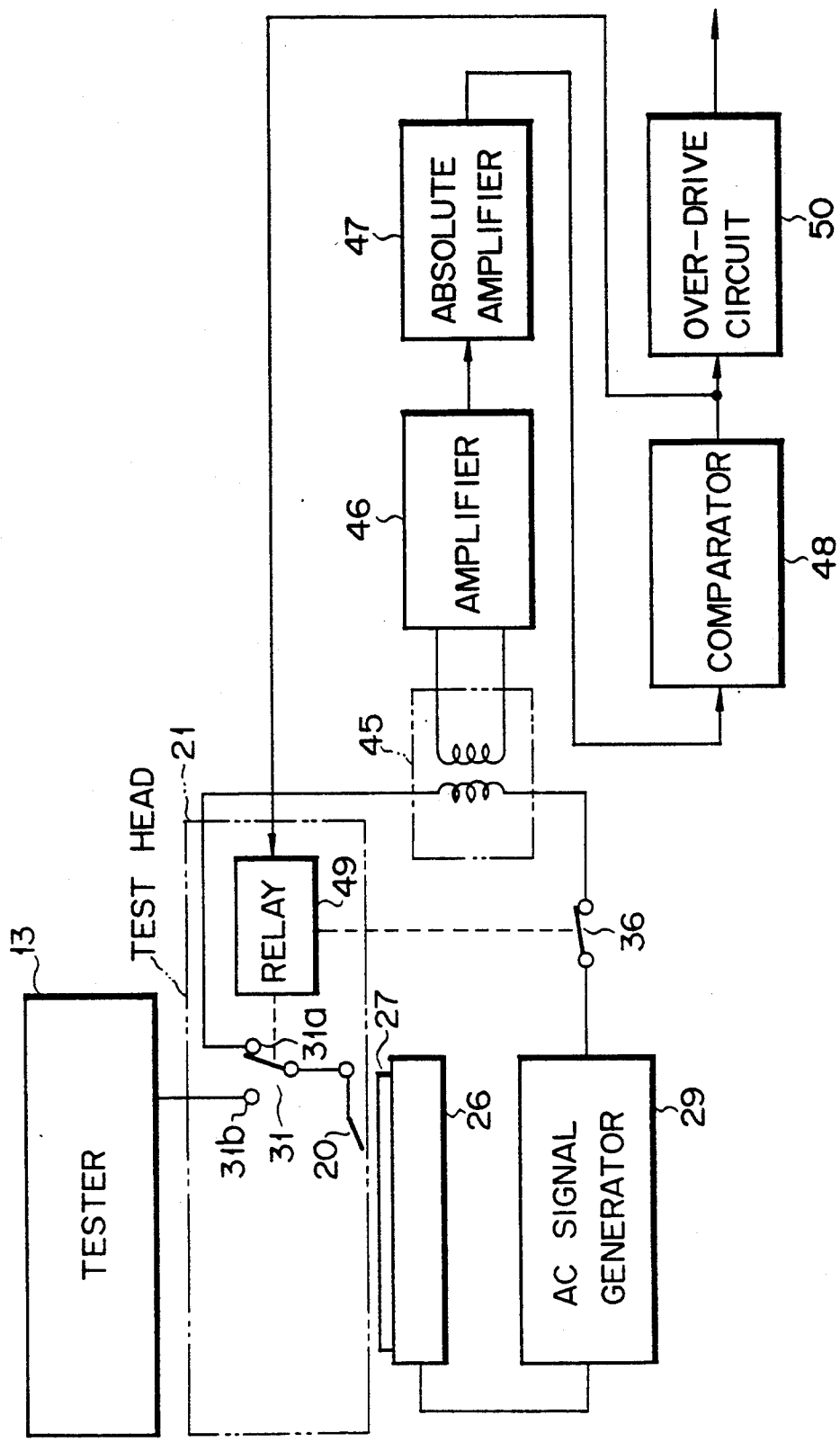
F I G. 6

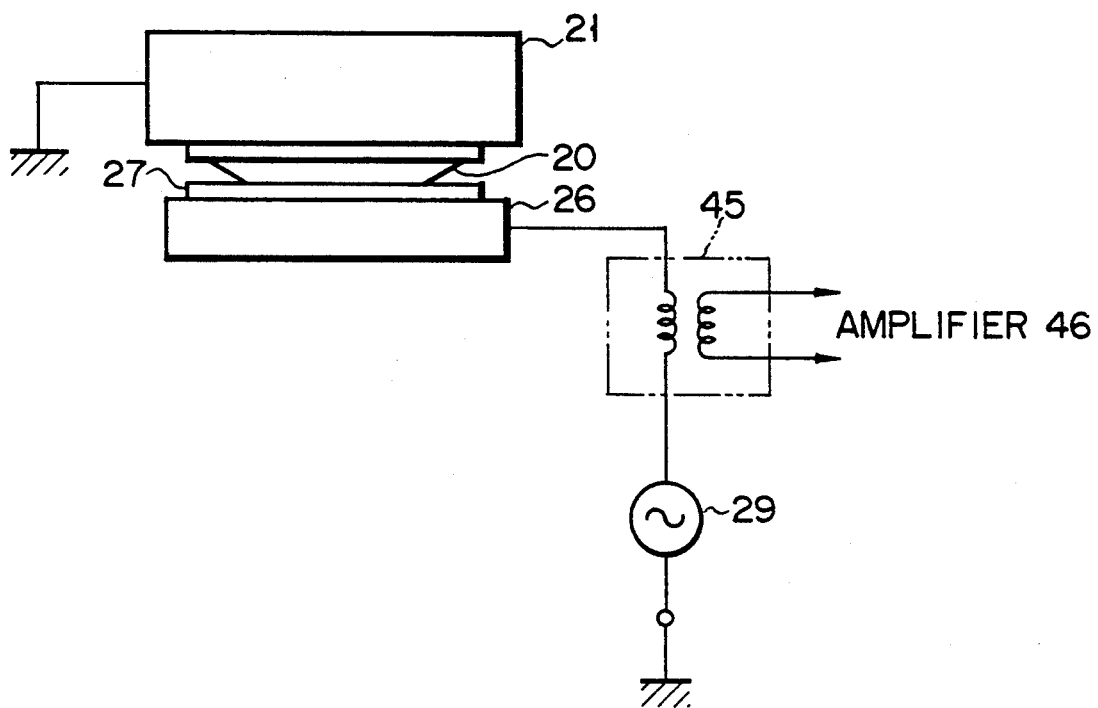
F I G. 7

TOUCH SENSOR UNIT OF PROBER FOR TESTING ELECTRIC CIRCUIT AND ELECTRIC CIRCUIT TESTING APPARATUS USING THE TOUCH SENSOR UNIT

BACKGROUND OF THE INVENTION

1. Field of the Invention

The present invention relates to a touch sensor unit used for a tester device for testing an electric circuit such as an integrated circuit and for detecting whether or not a prober for testing an electric circuit is in contact with the terminal of the electric circuit, and an electric circuit testing apparatus having the touch sensor unit.

2. Description of the Related Art

When a semiconductor element and particularly an IC (integrated circuit) is manufactured, 500 to 600 pieces of semiconductor chips are formed on a semiconductor wafer at the same time. After these chips are divided, the chips are contained in a predetermined package to complete an IC element. In this case, before the chips of the wafer are divided, electric characteristics of the respective chips of the semiconductor wafer are measured.

The measurements are conducted by contacting a plurality of testing probers, i.e., probe needles with a plurality of electrode pads of a semiconductor chip, respectively, and connecting the semiconductor chip to a measuring unit (tester) through the probe needles. In this case, a prober card on which a number of probe needles are provided is employed, and this prober card is mounted above a semiconductor wafer. The wafer is placed on a placing base movable in directions X, Y and Z. The base is moved to align the probe needles with the electrode pads. If the probe needles are aligned with the electrode pads, the base is raised in the direction Z (vertical direction), and the probe needles touch the electrode pads. At this time, the wafer is moved so that the wafer and the prober card are adjacent to each other, that is, the base is further raised at a predetermined distance from the height position where the probe needles touch the electrode pads (hereinafter merely referred to as "a touch position") so that predetermined needle pressure is applied to the probe needles to completely electrically contact the probe needles with the electrode pads. This movement from the touch position is called "an over-driver", and the moving distance is called "an over-drive distance".

Heretofore, the touch sensing has been carried out by a method for visually observing by an operator, an edge sensor for mechanically detecting the touch by a switch, or a needle sensor for detecting that a dc loop is closed when the probe needles are contacted with the electrode pads by supplying a dc current to the probe needles in contact with the street of the semiconductor chip.

When the touch sensing is carried out by an operator's visual observation, an irregularity occurs in the detected positions in accordance with the operator, and the same over-drive distance is detected differently in accordance with the needle pressure. Therefore, if the needle pressure is excessively applied, aluminum of the electrode pad is, for example, pierced by the probe needle to malfunction an IC. Particularly, if the IC chip has an high integrated density such as 4M, 16M and 64M, the electrode pad becomes as thin as the thickness of several micro-meters. As a result, the electrode pad is easily broken by the probe needle and thus the number of defective IC chips increases.

On the other hand, if the needle pressure is excessively low, a spontaneous oxide film formed on aluminum electrode is not pierced by the probe needle and the electrode pad is not in contact therewith, thereby disabling a correct measuring check of the IC chip.

Therefore, a method of detecting the touch, using an edge sensor or a needle sensor is considered, but according to the method of employing the needle sensor, if a circuit is formed in the street of the semiconductor chip, the touch sensing cannot be carried out due to an insulating film of the circuit.

According to the method of employing the edge sensor, the edge sensor is relatively expensive and a pressure must be applied to the sensor to mechanically detect the touch. Thus, a large irregularity occurs at the touch sensing position, and the method has a similar problem to that of the method for visually observing by an operator. Further, since it is necessary to apply a considerably high needle pressure to the probe needle so as to mechanically operate the edge sensor, there is an apprehension that the electrode pads, i.e., aluminum electrodes further reduced in thickness upon higher integration are pierced by the probe needles, and the method of employing the edge sensor is accordingly not practical.

Recently, the high integration of an IC chip is advanced to 32 Mbits and then 64 Mbits. In such a high integration IC chip, the electrode pads are considerably reduced to 30 to 60 μm.

If a test for electric characteristics of the chip of a wafer is carried out in the state wherein its touch sensing is uncertain, even a normal chip is detected as being malfunctioned to deteriorate its yield. Therefore, in a semiconductor field, it is desired to develop a wafer prober which ensures a touch sensing.

SUMMARY OF THE INVENTION

The object of the present invention is to provide a touch sensor unit for electrically sensing a touch of a to-be-tested electric element with a probe element by supplying an ac signal to the to-be-tested element or the testing probe element and an electric circuit testing apparatus having the touch sensor unit.

According to the present invention, there is provided a touch sensor unit, comprising an ac signal generator for supplying an ac signal to a to-be-tested element or a testing probe element, and a touch sensor for sensing formation of an ac signal loop when the testing probe element and the to-be-tested element are relatively approached to each other so that both are touched with each other.

According to the present invention, there is provided an electric circuit testing apparatus, comprising a touch sensor unit including an ac signal generator for supplying an ac signal to a to-be-tested element or a testing prober stylus, and a touch sensor for sensing formation of an ac signal loop when the testing prober stylus and the to-be-tested element are relatively approached so that both are touched with each other; an over-drive unit for moving at least one of the to-be-tested element and the testing probe element at a predetermined distance in the approaching direction to ensure the electrical contact of the to-be-tested element with the testing probe element in response to a touch sensing; and a tester operating in response to the touch sensing for measuring the electrical characteristics of the to-be-tested element through a testing prober.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing the structure of an electric circuit testing apparatus according to the present invention;

FIG. 4 is a circuit diagram showing the principle of a touch sensor unit of FIG. 1;

FIG. 5 is an equivalent circuit diagram showing the touch sensor unit of FIG. 4;

FIG. 6 is a block circuit diagram showing the touch sensor unit;

FIG. 7 is a schematic view showing the structure of a touch sensor unit according to a modified embodiment of the invention;

DETAILED DESCRIPTION OF THE PREFERRED EMBODIMENTS

An electric circuit testing apparatus, i.e., a wafer tester for testing a semiconductor wafer shown in FIG. 1 comprises a wafer prober 11, an insert ring assembly 12, and a tester 13. The wafer prober 11 includes a cassette table (not shown) for containing a wafer cassette, a conveyor for conveying the wafer cassette to a main chuck to be described later, a loader/unloader unit for placing the wafer on the main chuck and moving the wafer on the main chuck to a waver conveyor, an automatic alignment mechanism for optically detecting the alignment of the wafer to be placed on the main chuck and a pattern of a wafer chip, and a X-Y-Z mechanism for moving the main chuck in directions X, Y and Z. The wafer prober 11 further includes a CPU (not shown) electrically connected to the tester 13 for transmitting and receiving a test program and a test control data and the CPU is controlled by a microcomputer 14.

Figure 2:
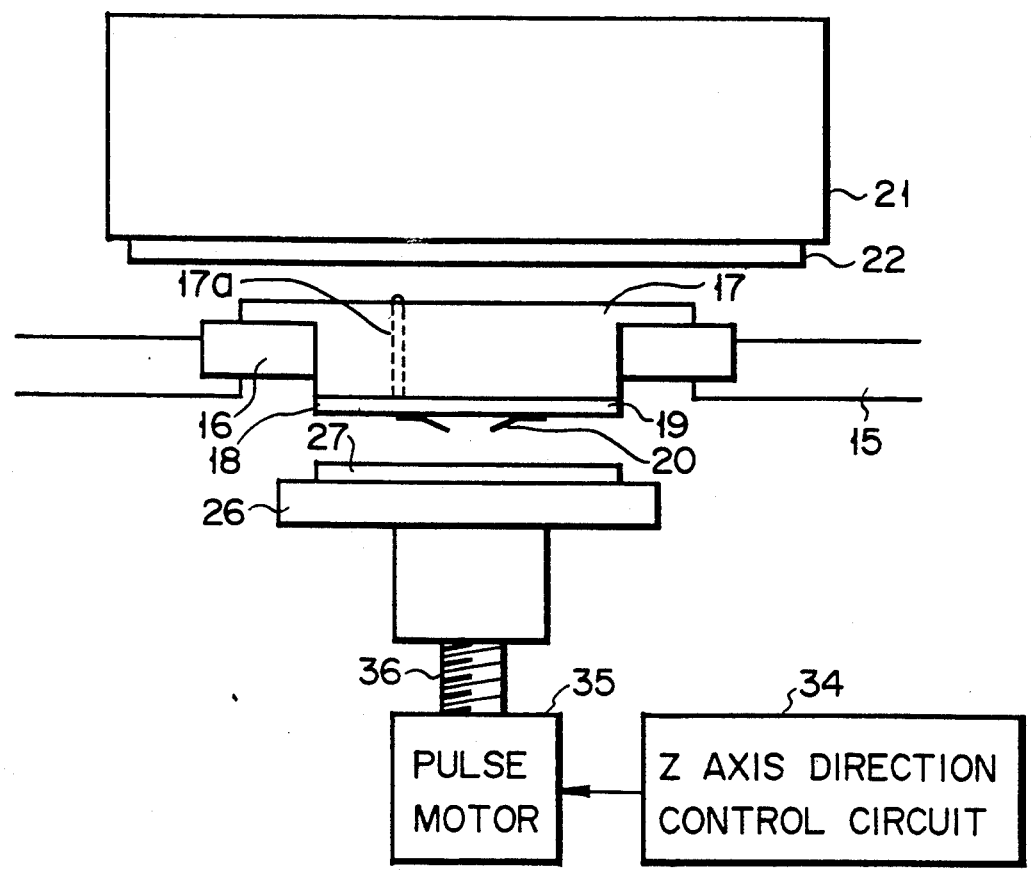
FIG. 2 is a view showing the schematic structure of an insert ring assembly of FIG. 1.
Figure 3:
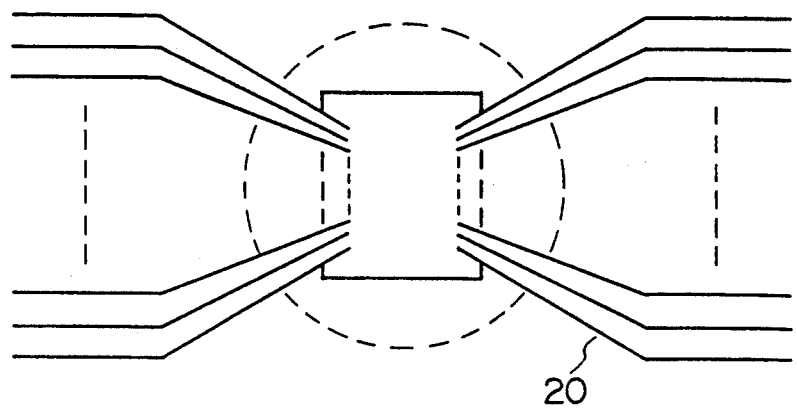
FIG. 3 is a schematic plan view of a prober card shown in FIG. 2.

The insert ring assembly 12 comprises, as shown in FIG. 2, a ring-shaped mounting base detachably mounted in an opening of a head plate 15, i.e., an insert ring 16, a card socket 17 to be mounted on the insert ring 16, and a prober card 18 to be mounted on the card socket 17. The prober card 18 includes, a printed board 19 on which wirings are printed, and a plurality of probe elements or probe needles 20 mounted on the board 19 as shown in FIG. 3 and connected to the printed wirings. The prober card 18 may be clamped to the card socket 17 with a screw.

The insert ring assembly 12 of the above-described structure is replaced in accordance with the types of the to-be-tested wafer.

A test head 21 is openably provided on the insert ring assembly 12. A performance board 22 is mounted on the lower surface of the test head 21. The performance board 22 is connected to the prober card 18 through a touch pin 17a provided on the card socket 17. On the performance board 22, a circuit for selecting a relay provided on the test head 21 in according to a test program is mounted. The test head 21 is connected to the tester 13 through a cable. The test head 21 is connected to the tester 13 through a cable. A printer 23 and a display 24 are connected to the tester 13.

In the test head 21, a touch sensor unit 25 for sensing that an electric conductive member, for example, at least one of the probe needles 20 of a probe needle array or a monitor probe needle for a touch sensing is contacted with an electrode pad of a wafer 27 placed on a wafer chuck 26 provided at the wafer prober 11, is provided. The touch sensor unit 25 may be put on the wafer prober 11. In this case, the ac signal is supplied to the chuck 26 disposed on the wafer 27.

The touch sensor unit 25 has a circuit structure as shown in FIG. 4 in principle. Specifically, a substrate terminal 28 provided at the chuck 26 is connected to one end of an ac signal generator 29 for generating an ac signal having, for example, approx. 1 kHz to 10 kHz and 10 kHz to 100 kHz and preferably 1 kHz of frequency. The frequency of the ac signal is determined in accordance with the type of the to-be-tested wafer so as not to generate a crosstalk and an interval of the probe needle. The other end of the ac signal generator 29 is connected to one end of a detecting resistor 30, and the other end of the resistor 30 is connected to one probe needle 20 of the prober card 18 through the terminal 31a of a switch 31. The probe needle 20 is touched on the electrode pad of a semiconductor chip on the semiconductor wafer 27, for example, the electrode pad 27a of a ground (GND). The terminal 31b of the switch 31 is connected to the tester 13.

Both ends of the resistor 30 are respectively connected to the input terminal of an amplifier 32. The amplifier 32 amplifies a voltage appearing between the terminals of the resistor 30. The output terminal of the amplifier 32 is connected to one input terminal of a comparator 33. The comparator 33 compares the output of the amplifier 32 with a reference potential, and outputs a signal responsive to a compared result. The output signal of the comparator 33 is supplied to a Z-axis direction control circuit 34 provided on the wafer prober 11.

The operation of the touch sensor unit 25 will now be described.

At the initial time of an operation for making the electrode pad touch the probe needle, for example, an operation for making the chuck 26 rise, the wafer 27 on the chuck 26 and the prober card 18 are separated, for example, 500 μm. In this state, the wafer is moved in the X and Y axis direction to position the probe needle at a predetermined one of the chips of the wafer, and then the Z-axis direction control circuit 34 provided on the wafer prober 11 supplies at the position of the chuck 26 as an initial position Z0 at this time a motor drive pulse to a pulse motor 35. At this time, the Z-axis direction control circuit 34 sequentially counts the number of output pulses from "0".

The pulse motor 35 is rotated each time when the pulse motor 35 receives a pulse. Thus, the chuck 26 is gradually raised, and the wafer 27 approaches the probe needle 20. When the electrode pad 27a of a predetermined one of the IC chips formed on the wafer 27 touches with the probe needle 20, an ac signal loop is formed as shown in an equivalent circuit diagram of the touch sensor unit 25 in FIG. 5. More specifically, in FIG. 5, a resistance 41 is a contact resistance between the probe needle 20 and the electrode pad 27a, a capacity 42 is a capacitance to be formed by a spontaneous oxide film formed on the surface of the electrode pad 27a made of aluminum, and a diode 43 is a diode in which its direction is determined according to whether or not the substrate (wafer) of the semiconductor chip is an N-channel or a P-channel.

When the ac signal loop as shown in FIG. 5 is formed, an ac signal is sent to the resistance 30, and the signal is amplified by the amplifier 32. The level of the amplified ac signal is compared by the comparator 33 with the reference potential. Therefore, the comparator 33 outputs a compared resultant signal, i.e., a touch sensing signal. In this case, since a circuit loop formed of the connection of the probe needle 20 with the electrode pad 27a is an ac signal loop, the touch sensor unit 25 can sense the touch irrespective of the direction of the diode, and can also sense the touch even if it does not protrude through the spontaneous oxide film even in the state wherein the spontaneous oxide film exists. More specifically, even if the spontaneous oxide film is not pierced, the touch can be sensed.

A touch sense signal to be output from the comparator 33 is supplied to the Z-axis direction control circuit 34. The Z-axis direction control circuit 34, receiving the touch sense signal, stops supplying of the drive pulse to the pulse motor 35 and stores the number of pulses Pn at this time as information of touch position Zc. Then, the Z-axis direction control circuit 34 rises the chuck 26 from the sensed touch position Zc further up to a position Zm raised at a predetermined over-drive amount, for example, at a distance of 20 to 150 μm, normally 60 μm so as to enhance the touch of the probe needle 20 with the electrode pad 27a, i.e, to reduce a contact resistance between both, and then stops it at this position Z. This over-drive distance is determined in consideration with an irregularity in the parallelism of a wafer stage, an irregularity in the surface of the wafer, an in the probe needles, etc., and the over-drive distance is fundamentally determined to a value in such a manner that the end of the probe needle pierces an oxide film formed on the surface of the electrode pad but does not pierce the electrode pad and is electrically sufficiently contacted with the electrode pad.

When the touch of the probe needle with the electrode pad is sensed as described above, the switch 31 is shifted to its contact 31b, and the probe needle 20 is connected to the tester 13. Thus, the tester 13 starts testing of the electrical characteristics of the corresponding chip of the wafer 27 in response to the test start signal sent from the wafer prober 11. The test resultant data output from the tester 13 is sent to the microprocessor 14 through the wafer prober 11, and processed. The processed resultant data is transferred to the printer 23 and the display 24 for printing and displaying the data.

FIG. 6 shows a concrete block circuit diagram of the touch sensor unit 25, and the present invention will be described in more detail with reference to the block circuit diagram.

FIG. 6 shows a concrete block circuit of the touch sensor unit 25, and the present invention will now be described in more detail with reference to this block circuit. In FIG. 6, one end of the ac signal generator 29 is connected to the chuck 26, and the other end of the ac signal generator 29 is connected to one end of a touch sensor 45 through a relay switch 36. The other end of the touch sensor 45 is connected to the contact 31a of the relay switch 31. The touch sensor 45 corresponds to the touch sensing resistor 30 of FIG. 4.

In this embodiment, a transformer is employed as the touch sensor 45. More specifically, the other end of the ac signal generator 29 is connected to the contact 31a of the relay switch 31 through the relay switch 36 and the primary winding of the transformer of the touch sensor 45. The secondary winding of the transformer of the touch sensor 45 is connected to the input terminal of an amplifier 46. The output terminal of the amplifier 46 is connected to the input terminal of an absolute amplifier 47. The absolute amplifier 47 is provided to amplify an input signal even if the input signal is a half-wave signal. The output terminal of the absolute amplifier 47 is connected to the input terminal of a comparator 48. The comparator 48 compares a level of a touch sensing signal to be output from the absolute amplifier 47 with a reference level, and outputs a sensing output signal. The sensing output signal to be output from the comparator 48 is input to an overdrive circuit 50 of the Z-axis direction control circuit contained in the wafer prober 11. The over-drive circuit 50 drives the pulse motor 35 to over-drive the probe needles 20, i.e., to further apply a needle pressure to the probe needles from its touch position.

The output terminal of the comparator 48 is connected to a relay 49. The relay 49 is energized by the sensing output signal from the comparator 48 to shift the switch 31 to its contact 31b, thereby connecting the probe needle 20 to the tester 13. The relay switch 49 opens the switch 36 to open the circuit of the touch sensing unit 25. Thus, since the ac signal generator 29 is disconnected from the touch sensor 45, it can prevent the leakage component of the ac signal from being detected by the touch sensor 45 by the tester 13 during testing.

FIG. 7 shows another example of touch sensing. According to the another example of the touch sensing, the ac signal generator 29 is connected between the chuck 26 and a ground terminal to ground the test head 21. In this example, when the probe needle 20 is contacted with the electrode pad of the wafer 27, an ac signal generated from the ac signal generator 29 is fed to a ground electrode through the primary winding of the touch sensor 45, the chuck 26, the wafer 27, the probe needle 20 and the test head 21. Therefore, this ac signal is sensed by the touch sensor 45. According to such a structure, since the touch sensing is carried out merely by inserting the connecting pin of the touch sensing unit 24 to the wafer prober 11, the touch sensing unit 25 can be applied to a wafer tester of any type. Particularly, since the transformer is employed as the touch sensor 25, even a micro ac signal can be detected to enhance the touch sensing accuracy.

Then, a Z-axis direction moving system for moving the chuck 26 in the direction Z according to another embodiment of the inventing will be described by referring to the flowchart of FIG. 8 and the circuit of the Z-axis direction control circuit 34 of FIG. 9.

The Z-axis direction control circuit 34 controls the pulse motor 35 to control the rising and lowering of the chuck 26, thereby controlling the moving speed of the chuck 26. The Z-axis direction control circuit 34 is operated in accordance with a program set in the microcomputer 14 to control the movements of the chuck 26 as below.

First, the Z-axis direction control circuit 34 sets a height position Zd lower than the touch position Zc sensed as described above prior to the control of the rising movement of the chuck 26, and stores the number of pulses Pd to be supplied to the pulse motor 35 to move the chuck 26 from the initial position Z0 of the chuck 26 to the position Zd and the number of pulses Pm necessary to move the chuck 26 from the initial position Z0 to a test position Zm in a memory 51. The number of pulses Pm is determined by the sum of the number of pulses necessary from when the chuck 26 is moved from the initial position Z0 to when the prober stylus 20 reaches the touch sensing position Zc where the prober stylus 20 is in contact with the electrode pad of the wafer 27 and the number of pulses necessary to overdrive the probe needle 20.

Figure 8:
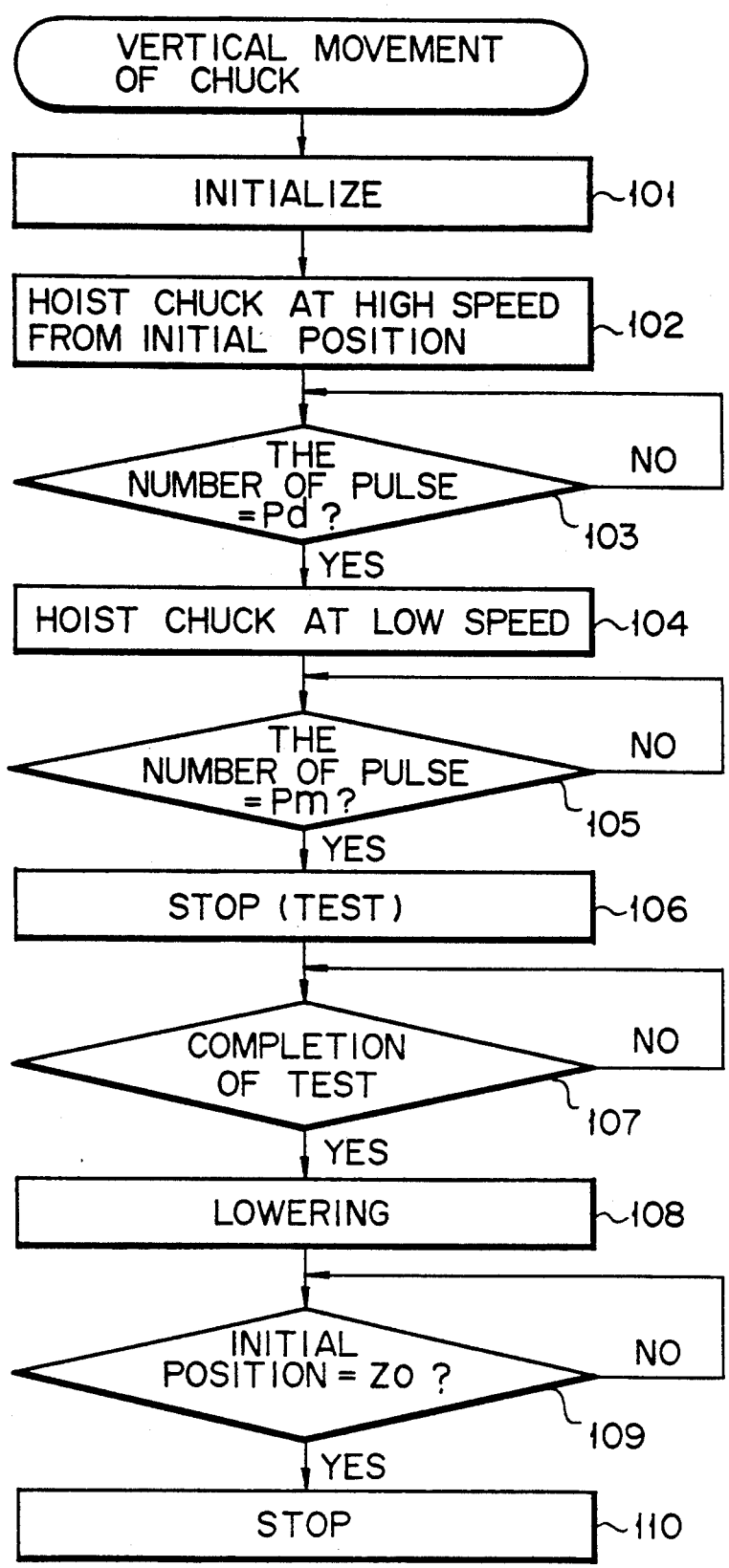
FIG. 8 is a flowchart for explaining the operation of a Z-axis direction moving circuit.
Figure 9:
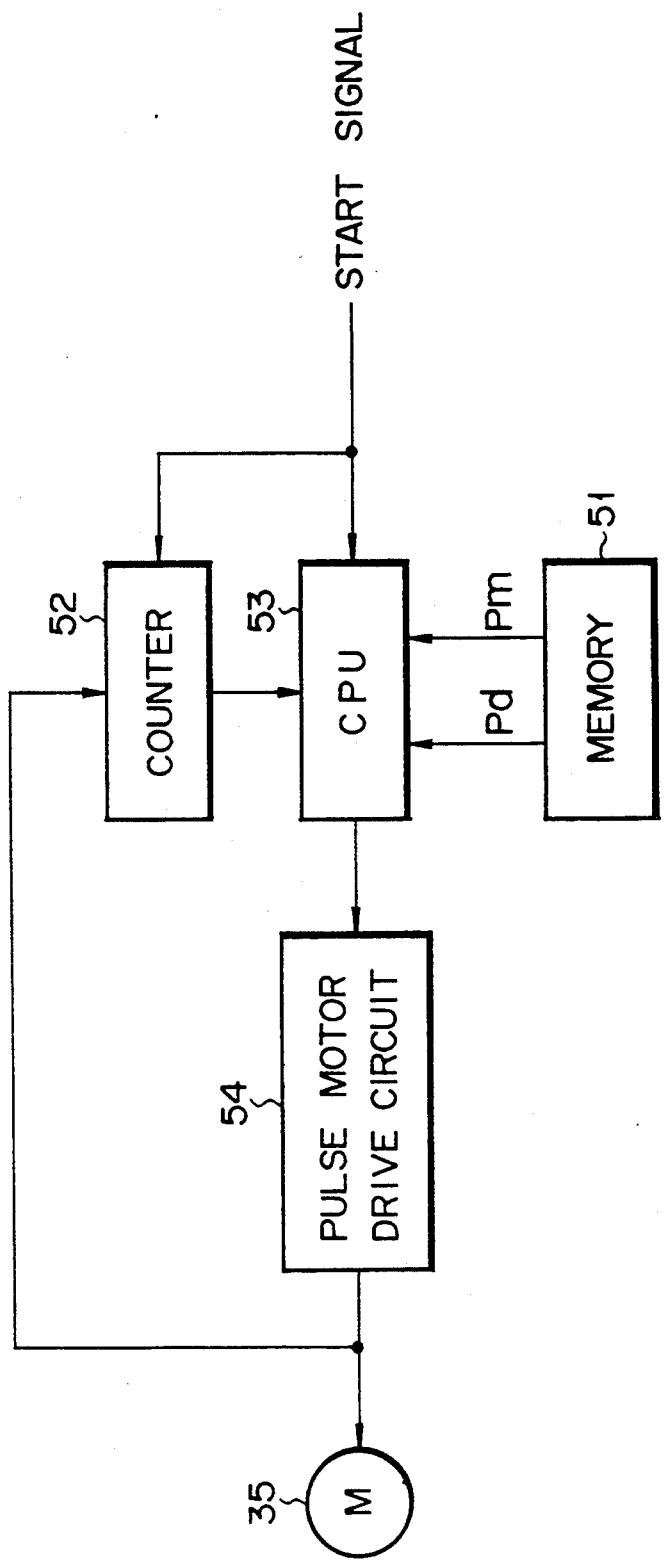
FIG. 9 is a circuit diagram showing the Z-axis direction moving circuit.

The movements of the chuck 26 are controlled in the above described state as shown in the flowchart of FIG. 8.

First, the Z-axis direction control circuit 34 is initialized to reset the pulse counter 52 of the Z-axis direction control circuit 34 to "0" (step 101).

Then, a CPU 53 of the Z-axis direction control circuit 34 supplies a high speed rising signal to the pulse motor drive circuit 54 at the initial position Z0 of the chuck 26 in response to a start signal. The pulse motor drive circuit 54 supplies a rising high speed pulse signal to the pulse motor 35 in response to the high speed rising signal, for rising the chuck 26 at a high speed (step 102). At this time, the number of pulses of the pulse signal to be supplied to the pulse motor 35 is counted by the counter 52.

When the CPU 53 judges that the counted value of the counter 52 becomes Pd in the high speed rising state and the pulses of the number necessary to move the chuck 26 to the set position Zd are supplied to the pulse motor 35 (step 103), the CPU 53 alters the high speed rising signal to a low speed rising signal (step 104). The pulse motor drive circuit 54 supplies the rising low speed pulses to the pulse motor 35 in response to the low speed rising signal. Therefore, the chuck 26 is raised at a low speed.

When the CPU 53 judges that the counted value of the counter 52 becomes Pm in the low speed rising state and the pulses of the number necessary to move the chuck 26 from the position Zd to the test position Zm are supplied to the pulse motor 35 (step 105), it stops supplying of the drive pulses to the pulse motor 35 to stop the rising movement of the chuck 26 (step 106). At this time, since the rising speed of the chuck 26 is low near the test position Zm and the chuck 26 is risen by micro steps of 1 to 10 μm, an overshoot when the rising of the chuck 26 is stopped at the test position Zm is small to prevent the probe needle from being projected to collapse the electrode pad.

Then, when the CPU 53 recognizes the end of the measurement of the electrical characteristics of the wafer (step 107), it supplies a lowering signal to the pulse motor drive circuit 54. The pulse motor drive circuit 54 supplies lowering drive pulses to the pulse motor 35 in response to the lowering signal to lower the chuck 26 (step 108). The lowering of the chuck 26 can be carried out at a high speed. When the CPU 53 judges that the pulse of the number necessary to move the chuck 26 from the test position Zm to the initial position Z0 are supplied to the pulse motor 35 (step 109), it sends a stop signal for stopping supplying of the drive pulses to the pulse motor 35 to the pulse motor drive circuit 54 to stop lowering of the chuck 26 (step 110).

The moving control of the one wafer in the Z-axis direction is ended as described above, the chuck 26 is then horizontally moved by an X-Y stage (not shown), next wafer is delivered at an alignment position, and the next wafer is further placed and aligned. When the alignment of the wafer is ended, the chuck 26 is horizontally moved to the position under the test position, the new wafer is carried out for the above-described steps 101 to 110 to execute the test of the new wafer. The operation is then repeated.

In the above-described embodiment, the ball screw is employed in the Z-axis direction moving mechanism 36 for moving the chuck 26 in the direction Z. However, the Z-axis direction moving mechanism 36 is not limited to the particular embodiment. For example, an eccentric cam mechanism or the other mechanism may also be employed.

In the above-described embodiment, the ac signal is supplied, when the touch position is sensed, to the wafer 27 through the chuck 26. However, the supply of the ac signal is not limited to the particular embodiment. For example, the ac signal may be supplied to the probe needle. Further, an ac signal generator may be connected between two needles, and the formation of an ac signal loop is detected when the two needles are connected to electrode pads, thereby sensing the touch of the needle with the electrode pad. In this case, the positions of the two probe needles are disposed at the diagonal positions of the semiconductor chip of a rectangular parallelepiped shape to detect the touch of the needle with the electrode pad by eliminating an irregularity in the position of the pad or probe needle in the height direction. Further, a plurality of touch sensors may be provided. In this case, when the plurality of touch sensors detect the touch of the probe needles with the pads, the over-drive operation is started.

In the method of controlling the rising movement of the chuck, the method of sensing the touch position Zc of the needle with the electrode pad to obtain a reference for determining the set position (the height position lower than the touch position Zc) for altering the rising speed of the chuck is not limited to the example shown in FIG. 2. For example, it may be a method of visually observing or a method with an edge sensor or a needle sensor. Further, the chuck may be risen to the touch position at a high speed, and may be risen at a distance corresponding to the over-drive at a low speed.

Instead of rising or lowering the chuck, the assembly including the probe needle may be risen or lowered.

Moreover, the present invention is not limited to the test of the semiconductor chip formed on the wafer. For example, the present invention may be applied to the test of a packaged semiconductor chip or an LCD (liquid crystal display) board, test of a printed board, or the other tests of an element to be tested.

According to the present invention as described above, the touch of the test needle with the element to be tested is sensed by detecting the formation of the ac signal loop. Therefore, the touch position may be sensed including the spontaneous oxide film formed on the surface of the electrode pad, thereby sensing the touch substantially without scratching the electrode. Since the sensing of the touch is detected by the ac signal loop, even if the semiconductor substrate is of N-channel or P-channel, the touch can be assuredly sensed.

According to the present invention, personal difference such as sensing of the touch by an operator's visual observation, an irregularity in the sensing of an edge sensor, etc., are almost obviated. Therefore, when the over-drive distance is determined with the touch position as a reference, the electrical characteristics of the element to be tested may be measured in the state that a predetermined stylus pressure is always applied to the element to be tested of the same type, thereby accurately measuring the characteristics thereof.

In the above-described embodiments, when the base for placing the element to be tested is approached to the test probe needle, the base is moved at the high speed up to the predetermined proximity position before the position of contacting the element to be tested with the measuring probe needle, and then moved at the low speed. Therefore, the overshoot when the base is stopped at the testing position is small to prevent the probe needle from piercing the electrode pad.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An electric circuit measuring apparatus comprising:
   probe means having a plurality of test probe styluses including at least one stylus used as a monitor probe stylus;
   placing means provided opposite to said probe means, in which a to-be-tested microelectronic device having a pluralilty of pads is placed;
   moving means for relatively moving said probe means and said placing means in a first direction in which said probe means and said placing means approach each other; and a second direction in which they separate from each other;
   AC signal generating means for supplying an AC signal to at least one of said to-be-tested microelectronic device and said monitor probe stylus;
   touch sensing means connected to the monitor probe stylus, for sensing the AC signal from said signal generating means which flows through said microelectronic device and the monitor probe stylus via capacitive coupling when said monitor probe stylus to which the AC signal is supplied comes into contact with oxide coating spontaneously formed on at least one of the pads of said to-be-tested microelectronic device thereby sensing the touching of the monitor probe stylus and the one of the pads;
   over-drive means for moving at least one of said to-be-tested microelectronic device and said test probe styluses at a predetermined distance in said first direction to ensure electrical contact between said to-be-tested microelectronic device and said test probe styluses in response to the touch sensing by said touch sensing means;
   tester means for measuring electrical characteristics of said to-be-tested microelectronic device through said probe means; and
   switch means for disconnecting the monitor probe stylus from said touch sensing means and connecting said probe styluses including the monitor probe stylus to said tester means at the same time when said over-drive means moves at least one of the tested microelectronic device and the test probe styluses by means of said over-drive means.

2. An electric circuit measuring apparatus according to claim 1, wherein said touch sensing means is provided in said AC signal loop formed of said to-be-tested microelectronic device, said probe styluses and said AC signal generating means, and includes a signal detector for detecting the AC signal flowing in said AC signal loop.

3. An electric circuit measuring apparatus according to claim 2, wherein said signal detector comprises a transformer having a primary winding through which said AC signal flows and a secondary winding, and a detector for detecting an AC signal included in the secondary winding of said transformer when the AC signal flows through said primary winding.

4. An electric circuit measuring apparatus according to claim 1, wherein said AC signal generating means generates an AC signal of 1 kHz to 100 kHz.

5. An electric circuit measuring apparatus according to claim 2, wherein said touch sensing means includes means for opening said AC signal loop in response to signal detection by said signal detector.

6. An electric circuit measuring apparatus according to claim 1, wherein said to-be-tested microelectronic device includes a plurality of chips each having at least one electrode layer, and said over-drive means comprises means for moving said placing means toward said probe means at a distance corresponding to a thickness of a spontaneous oxide layer formed on a surface of said electrode layer in order to make said probe stylus pierce the oxide layer.

7. An electric circuit measuring apparatus according to claim 6, wherein said over-drive means moves said placing means to a position 20 $\mu$m to 150 $\mu$m from a position at which said monitor probe stylus touches said electrode layer.

8. An electric circuit measuring apparatus according to claim 1, wherein said moving means moves said placing means from the initial position of said placing means at high speed, and moves said placing means from a position approaching a position where said monitor probe stylus is in contact with one of the pads of said to-be-tested microelectronic device at low speed.

9. A touch sensing unit used for an electric circuit testing apparatus including moving means by which a microelectronic device on which at least one pad is formed and probe means having at least one probe element touching the pad are relatively moved so that they approach each other, comprising:
   AC signal generating means for generating an AC signal, said AC signal generating means connected to one of said microelectronic device and said probe means; and
   touch sensing means for sensing the AC signal of said signal generating means which flows through said pad and said probe element via a capacitive coupling when said probe element comes into contact with oxide coating spontaneously formed on the pad, in relative movement of said microelectronic device and said probe means by means of said moving means, and outputs a detection signal indicating touching of the probe element to the pad to said moving means so as to stop said moving means, said touch sensing means being connected between said AC signal generating means, and one of said microelectronic device and said probe means, and comprising a transformer having a primary winding through which said AC signal flows and a secondary winding, and a detector for detecting an AC signal induced in the secondary winding of said transformer when said AC signal from said AC signal generating means flows through said primary winding.

10. A touch sensing unit according to claim 9, wherein said touch sensing means further comprises an amplifier for amplifying the AC signal detected by said detector.

11. A touch sensing unit according to claim 9, wherein said signal detector comprises means for detecting an AC signal flowing to a ground when said pad is in contact with said probe element.

12. A touch sensing unit according to claim 9, wherein said AC signal generating means generates an AC signal of 1 KHz to 100 kHz.

13. A touch sensing unit according to claim 9, wherein said touch sensing means includes means for cutting off said AC signal generating means in response to signal detection by said signal detector.

14. An electric circuit measuring apparatus according to claim 1, wherein said switching means comprises a relay switch for switching said probe styluses including the monitor stylus to said tester means in response to the touch sensing by said touch sensing means.

15. An electric circuit measuring apparatus according to claim 1, wherein said monitor stylus is used as a test probe stylus for measuring the electrical characteristics of the microelectronic device after sensing the touching of the monitor probe stylus and one of the pads.

16. A touch sensing unit according to claim 9, wherein said AC signal generating means is connected between the primary winding of said transformer and a ground, and said detector of said sensing means detects an AC signal flowing to the ground through said transformer when said probe element came into contact with the oxide coating on the pad.

* * * * *